(12) United States Patent
Whitlock et al.

(10) Patent No.: US 6,858,372 B2
(45) Date of Patent: Feb. 22, 2005

(54) RESIST COMPOSITION WITH ENHANCED X-RAY AND ELECTRON SENSITIVITY

(75) Inventors: Robert R. Whitlock, Washington, DC (US); Arthur Snow, Alexandria, VA (US); Charles M. Dozier, Jacksonville, FL (US); Samuel G. Lambrakos, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 83 days.

(21) Appl. No.: 10/394,240

(22) Filed: Mar. 24, 2003

(65) Prior Publication Data

US 2004/0191669 A1 Sep. 30, 2004

(51) Int. Cl.$^7$ ............................................... G03F 7/004
(52) U.S. Cl. .................... 430/270.1; 430/311; 430/942; 430/966
(58) Field of Search ............................. 430/270.1, 311, 430/966, 942

(56) References Cited

U.S. PATENT DOCUMENTS

| 6,245,494 | B1 | * | 6/2001 | Andriessen et al. ........ 430/346 |
| 6,410,935 | B1 | * | 6/2002 | Rajh et al. ..................... 257/43 |
| 6,607,845 | B2 | * | 8/2003 | Hirai et al. ................. 428/641 |
| 6,627,314 | B2 | * | 9/2003 | Matyjaszewski et al. ... 428/403 |
| 6,703,171 | B2 | * | 3/2004 | Hattori et al. ................. 430/5 |
| 2003/0047816 | A1 | * | 3/2003 | Dutta ......................... 257/788 |

* cited by examiner

Primary Examiner—Amanda Walke
(74) Attorney, Agent, or Firm—John J. Karasek; Stephen T. Hunnius

(57) ABSTRACT

A resist composition with enhanced X-ray and electron sensitivity includes a plurality of chemically inert nanoparticles dispersed throughout a base resist material. The nanoparticles have a higher atomic number than the base resist material and each of the nanoparticles is formed by a nanoparticle core, e.g., of a noble metal, coated with an organic capping layer or shell. The latter renders the core dispersible and chemically compatible with the resist material surrounding the nanoparticle. A method of making a resist composition with enhanced X-ray and electron sensitivity is to provide a resist material and disperse chemically inert nanoparticles throughout the resist. The nanoparticles have a higher atomic number than the resist and a have core/shell structure. A resist composition with enhanced X-ray and electron sensitivity can be made by having a nanoparticle core, with a higher atomic number than the resist, that is coated with an organic capping layer. The nanoparticle with the core/shell structure is then dispersed throughout the resist material.

21 Claims, 2 Drawing Sheets

RESIST COMPOSITION WITH ENHANCED X-RAY AND ELECTRON SENSITIVITY

BACKGROUND OF THE INVENTION

1. Field of the Invention

The present invention relates to resists used in photolithography and more particularly, to an improved X-ray and electron sensitive resist material having increased specific absorption so as to provide enhancement of the lithographic processing of microcircuits.

2. Description of the Related Art

Resists for all modes of high resolution lithography require chemical changes induced by free electrons under control of an incident illumination or pattern writing beam. Free electrons are important in the exposure of the resist, regardless of whether the incident beam is formed by electrons, ions, or ionizing photons. Thinner resists with higher sensitivity are desirable for high resolution lithography.

The exposure levels and absorption in the resist thickness are set by the properties of the resist and the absorption statistics required to achieve pattern definition with high confidence. The resist must be exposed throughout its thickness. As a result of the requirement that the deepest layers of resist receive the exposure beam, and the fact that no thin layer is totally absorbing for any type of exposure beam, it is physically impossible for a resist to be both fully exposed and totally absorbing. Thus, some transmitted exposure beam will, of necessity, penetrate into the substrate, generally with some deleterious residual effects on the substrate.

Each absorption event in the resist, i.e., each event in which an incident beam particle or photon is absorbed, can expose a small volume element of resist. In a resist with low photoelectric absorption, many incident photons must pass through in order to produce absorptions and exposures in all resolvable volume elements. When the specific absorption of the resist is increased, fewer incident photons are required to produce absorption events and exposures of each volume element. The same statistics are required for absorbed events in both the lower and higher absorption types of resist, but the higher absorption resist achieves these statistics with fewer incident photons transmitted to the substrate. The reduced exposure requirements translate directly into reduced resist thickness, enhanced process throughput, or reduced radiation exposure to the resist and substrate.

Prior art efforts have sought to increase the X-ray absorption of resists by altering the molecular constituents of the resist to include higher atomic number elements such as sulfur and others. It is well known that higher atomic number elements increase the cross section for absorption of the incident beam. Adding new elements to resist polymers can only be accomplished as the corresponding chemistry allows, and can only be carried out to low concentration levels. Extensive investigations into this approach have involved significant levels of synthetic chemistry operating on the very molecules whose radiation chemistry and physical properties, not just radiation absorption, may also be affected. Altering the polymer chemistry alters the carefully developed polymer properties, a subject about which much is known in the field. (See C. P. Wong, editor, *Polymers for Electronic and Photonic Applications*, Academic Press, NY, 1993; Theodore Davidson, editor, *Polymers in Electronics*, American Chemical Society, Washington, D. C., 1984; and Eugene D. Feit, and Cletuw W. Wilkins, Jr., Editors, *Polymer Materials for Electronic Applications*, American Chemical Society, Washington, D.C., 1982.)

Within the field of X-ray lithography, a local dose enhancement effect (increase in exposure) at the resist/substrate interface has previously been observed by many workers and is due to the high atomic number substrate. (See D. J. D. Carter, A. Pepin, M. R. Schweizer et al., "*Direct measurement of the effect of substrate photoelectrons in x-ray nanolithography*," J. Vac. Sci. technol. B 15 (6), 2509–13 (1997).) As will appear, the present invention, in essence, puts this "substrate effect" to practical use by distributing the high atomic number absorber throughout the volume of the resist in a manner that is chemically and physically tractable.

SUMMARY OF THE INVENTION

In accordance with the invention, a resist composition is provided wherein the X-ray and electron sensitivity is enhanced by increasing the number of available electrons in a manner that does not require alterations to the resist chemistry. More specifically, the resist sensitivity is increased by increasing the specific absorption (e.g., absorption per unit volume) of the resist. Increasing the specific absorption is important because the greater the specific absorption, the greater the number of electrons released per unit volume, and thus the greater the chemical activity that is produced by the exposure.

The resist composition of the invention basically comprises chemically inert, readily dispersed, high atomic number, encapsulated nanoparticles added to a base resist material. As discussed below, in one important embodiment, the nanoparticles include a gold (Au) core. This embodiment is important because an Au nanoparticle core is over 40 times as absorptive to X-rays as an equivalent volume of paraffinic polymer, for the X-ray wavelengths of interest. Further, the high atomic number nanoparticle cores are preferably coated with an organic capping layer that renders them dispersible and chemically compatible with the surrounding resist material.

Thus, according to the invention, a resist composition is provided which has enhanced X-ray and electron sensitivity, the resist composition comprising: a base resist material, and a plurality of chemically inert nanoparticles dispersed throughout the resist material, the nanoparticles having a higher atomic number than the resist material and each of said nanoparticles comprising a nanoparticle core coated with an organic capping layer for rendering the core dispersible and chemically compatible with the resist material surrounding the nanoparticle.

In one preferred embodiment, the nanoparticles comprise ligand stabilized metal nanoclusters.

Preferably, the nanocore comprises a metal core and the encapsulating layer comprises an organic shell surrounding the metal core. Advantageously, the metal core comprises a noble metal. Preferably, the metal core has a diameter of between 1 and 10 nm.

In one preferred embodiment, the organic shell comprises a monomolecular layer of an organic surfactant. In a further preferred embodiment, the shell comprises a ligand molecule encapsulating the core. Advantageously, the shell has a thickness of between about 0.4 to 4 nm. Preferably, the ligand molecule has a chain structure and is terminated by a head functional group bonded to a metal atom at the surface of the metal core. In an important implementation mentioned above, the core comprises a gold core and, further, the ligand molecule comprises an alkane thiol in the range of C4–C16, such as octanethiol, bonded to the gold core.

More generally, the core preferably comprises a metal selected from the group consisting of noble metals, chromium, titanium and copper.

In one preferred embodiment, the resist material comprises of a matrix of a resist polymer film.

Although the nanoparticle core is preferably of a single material in some applications, in accordance with a further preferred embodiment, the nanoparticle core comprises a center core of a first material of a first average atomic number and an overlayer of a second material of a higher average atomic material. The second material comprises an x-ray absorber. In one preferred implementation, the second material comprises gold. In another preferred embodiment, the first material comprises polystyrene. Advantageously, the overlayer has a thickness no greater than that thickness required to attenuate approximately half of the electron energy.

Further features and advantages of the present invention will be set forth in, or apparent from, the detailed description of preferred embodiments thereof which follows.

DESCRIPTION OF THE PREFERRED EMBODIMENTS

Figure 1:
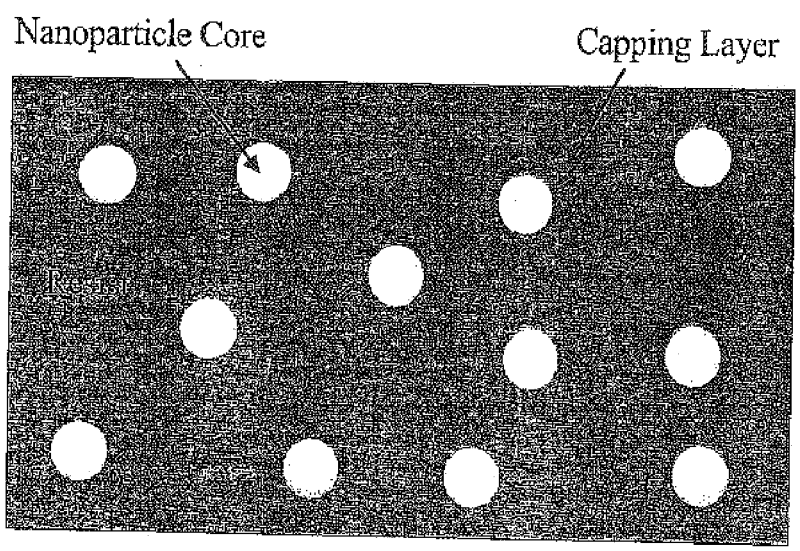
FIG. 1 is a schematic representation, not to scale, of a resist composition in accordance with a preferred embodiment of the invention.

As indicated above, in the resist compositions of the invention, the X-ray resist sensitivity is enhanced by increasing the number of available electrons in a manner that does not require alterations to the resist chemistry. More particularly, the resist sensitivity is increased by increasing the specific absorption (i.e., absorption per unit volume) of the resist. As was also discussed, the resist composition basically comprises a base resist material having added thereto chemically inert, readily dispersed, high atomic number encapsulated nanoparticles. In one important example mentioned previously, the nanoparticles include a gold (Au) core, it being pointed out that an Au nanoparticle core is over 40 times as absorptive to X-rays as an equivalent volume of paraffinic polymer, for the X-ray wavelengths of interest. Further, as described hereinbefore, the high atomic number nanoparticle cores are preferably coated with an organic capping layer that renders them dispersible and chemically compatible with the surrounding resist material. This basic resist composition is illustrated schematically in FIG. 1 of the drawings, wherein the resist material is denoted 10, and the dispersed nanoparticles are denoted 12. As shown, and as just described, the nanoparticles 12 each comprise a core 14 covered by or encapsulated by a shell 16.

For purposes of this application, the term "atomic number" refers to the
- atomic number if an element is concerned or to the density-weighted average atomic number if a compound or mixture is concerned.

Considering the nanoparticles in more detail, in one important embodiment, the nanoparticles comprise ligand stabilized metal nanoclusters. Ligand stabilized metal nanoclusters are a unique material consisting of a metal core and an organic shell. The core is frequently a noble metal and ranges from about 1 to 10 nm in diameter. The shell is usually a monomolecular layer of an organic surfactant or ligand molecule which encapsulates the core. The shell thickness depends on the size of the ligand molecule and ranges from about 0.4 to about 5 nm. The ligand molecule usually has a chain structure and is terminated by a head functional group that bonds to a metal atom at the core surface. An important example is alkane thiol bonding to a gold core. The ligand shell stabilizes the metal core against an irreversible agglomeration and allows the clusters to be processed as soluble materials. For example, it is possible to dissolve a cluster that is up to 90 weight percent gold in toluene. As a consequence, it is possible to make homogeneous blends of the clusters with organic polymers.

As indicated above, a unique feature of the present invention is that it allows existing resist chemistries to be retained without chemical interference from the nanoparticle cores, while increasing exposure sensitivity. As discussed previously and as illustrated in the drawings, the nanometer sized particle cores 14 are each encapsulated by an organic monomolecular capping layer 16 which is designed for chemical compatibility with the chosen resist polymer. The capping layer 16 also affects the agglomeration of the particle cores 14, such that metal nanoparticles 12 may be encapsulated and suspended indefinitely in solution. The thickness of the capping layer 16, and the size of the core 14, influence the effectiveness with respect to agglomeration and settling in an already determined manner.

The base resist material 10 can take a number of different forms and can be of different formulations. For example, encapsulated nanocrystalline particles may be dispersed and embedded within a matrix of a resist polymer film. Encapsulated underdense or encapsulated amorphous nanoparticles may be dispersed and embedded within a matrix polymer film. Different resist polymer formulations are accommodated by different chemical functionalities present in the respective encapsulating layers.

An important feature of the invention mentioned above is that the atomic number of the nanoparticle core is higher than that of the resist, since this provides a significant enhancement in absorptivity. As is discussed in more detail below, particles in the nanometer size range are readily synthesized and encapsulated. This size of nanoparticle core is consistent with the intended feature sizes (under 100 nm) desired to be achieved with the irradiation contemplated. With nanoparticle core sizes in the under approximately 10 nm range, many of the electrons liberated by 13 Å incident X-ray exposure will escape the capped nanoparticle with sufficient energy remaining to expose the resist. The increase in deposited energy, above that due to X-ray absorption in the polymer, and due to the electrons generated by the nanoparticle cores, is a dose enhancement. Thus, the resists of the invention are dose enhanced resists.

The nanoparticle enhanced resist of the invention retains its resolving power while increasing its sensitivity. Clearly, the nanoparticles themselves must be significantly smaller than the minimum resolvable feature size, e.g., 100 nm. Typical nanoparticle cores are no more than about 10 nm in diameter, and capping layers are typically less than 5 nm, with 1–2 nm preferable. Each absorption event, in which an incident X-ray photon is absorbed, can expose a small volume element of resist. The range of electrons escaping the nanoparticles must therefore be considered, as the electron range represents the distance over which resist chemistry is activated following the absorption event. The electron range is determined by the energy of the photoelectrons and Auger electrons that are liberated during, and following, the X-ray absorption event. However, this range varies depending on the energy of the absorbed X-ray and on the composition and size of the nanoparticle and the properties of the base resist. Thus, the electron range is a design parameter. As a reference, it is noted that the range of electrons liberated by 13 Å X-rays into the resist PMMA is on the order of 25 nm. (See D. J. D. Carter, A. Pepin, M. R. Schweizer et al., "*Direct measurement of the effect of substrate photoelectrons in x-ray nanolithography*," J. Vac. Sci. technol. B 15 (6), 2509–13 (1997).) It is anticipated that this figure will be representative of most polymer resists under similar irradiation conditions. The range of electrons emitted by Au nanoparticles will be considerably smaller than the 100 nm feature size.

The use of Cr or Ti nanoparticle cores would also offer enhanced X-ray absorption, but would provide electrons of an energy similar to that resulting from absorption in carbonaceous material, and would, therefore, have a similar range to electrons generated in unenhanced resists such as PMMA. In general, the composition of the cores may be designed for suitability of its X-ray absorption spectrum, or for its ability to provide electrons of a desired energy.

The maximum permissible loading levels of the nanoparticles is dependent on the particle size and on the X-ray absorption by the particles. A generally accepted processing criterion for X-ray resists dictates that the uniformity of exposure remain within a ~10% variation. This automatically requires that the resist absorb no more than 10% of the incident X-ray flux. Resists that are more absorbing than this are too sensitive, and must either be made less absorbing per unit volume, or thinner. It will be understood that the resist thicknesses of some resists in current use are less absorbing than 10%, and such resists would benefit from an increase in specific absorption.

The 10% absorption criterion also has implications for the largest permissible nanoparticle diameter. The absorption of Au for 1.1 keV (11 Å) photons is 10% for a planar thickness of 14 nm, a figure greater than the proposed size of the approximately spherical nanoparticles to be used for resist enhancement. For comparison, it is noted that a 5 mJ/cm$^2$ absorbed dose in an X-ray resist corresponds to an average of one photon (1.1 keV) absorbed per area element 2×2 nm square. Again, the size of nanoparticulates is compatible with effective X-ray exposure in the resist.

It may be instructive to examine a simple model of an X-ray resist exposure. In this model, it is assumed that an X-ray resist is exposed at an absorbed dose of exactly 10% of the incident X-ray flux I, at a resist thickness of 1.0 micrometers. Inclusion of nanoparticles would not be effective at this resist thickness, because the increased absorptivity would produce greater absorption in the 1.0 micrometer thickness than the allowed 10%. However, consider a model wherein the resist layer thickness is reduced to 400 nm. In this model, the incident flux required to expose the thinner resist would not change appreciably (because the absorption per unit volume has not changed). However, the total absorption would drop to ~4% of I (the same 4% that exposed the bottom 400 nm of the resist at its original 1 micrometer total thickness). The thinner resist, if loaded with nanoparticles that themselves absorb an additional 6% of the incident beam, would absorb the full 10% of the incident beam. However, the 400 nm layer only requires 4% (0.04*1) of the original incident beam exposure to be fully exposed. Thus, the incident exposure impinging on the enhanced resist may be reduced by ~2.5×(to 0.4*1) in order to achieve a full exposure in the thinned, sensitivity enhanced resist. In other words, the absorption in the enhanced resist is 10% of 0.41, which equals the 0.04*1 that exposed the unenhanced resist. However, the exposure of the 400 nm enhanced resist is accomplished with less than half the incident flux as compared to the unenhanced 1.0 micrometer resist. Thus, the enhanced resist offers a clear advantage in exposure time.

Thinner resists, such as those attainable with nanoparticulate enhancement, have well known advantages in reducing the geometric blurring in X-ray imaging exposures. Thinner resist layers have also been cited as advantageous for resolution purely because of chemical and physical factors in the resist film. (See P. M. Dentinger, C. M. Nelson, S. J. Rhyner et al., "*Resist application effects on chemically amplified resist response,*" Journal of Vacuum Science & Technology B 14 (6), 4239–4245 (1996).) For resists that are less than 10% absorbing, no further reduction of resist thickness is required in order to implement nanoparticulate sensitivity enhancement.

Nanocrystalline materials, with particle sizes in the about 1–10 nanometer range, have been shown to be suitable for applications in which the crystallites are encapsulated in an overlayer with chemistry amenable to design. Encapsulating layer length has been systematically varied on gold nanoparticles capped with straight paraffin chains. Particles overlayered with short chains can coalesce and precipitate out of solution, while longer chains result in permanent suspensions. Normally insoluble metallic nanoparticles may be suspended in solution indefinitely. Dr. Arthur Snow of the U.S. Naval Research Laboratory has developed synthesis methods of the type required for the novel dose enhanced resists of the invention. Reference is made to U.S. Pat. No. 6,221,673 to Snow for a description of these methods.

In the study of radiation effects on electronics, the dose enhancement effect due to interfaces of differing atomic numbers has been observed to be as large as an order of magnitude. (See E. A. Burke, L. F. Lowe, D. P. Snowden et al., "*The direct measurement of dose enhancement in gamma test facilfties,*" IEEE Transactions on Nuclear Science 36 (6 Part: 1–2), 1890–01895 (1989).) Dose enhancement effects in radiation sensitive electronic microcircuits have been quantitatively modeled and verified by Brown and Dozier for X-ray and UV irradiation. (See D. B. Brown and C. M. Dozier, "*Electron Hole Recombination in Irradiated SiO2 from a Microdosimetry Viewpoint,*" IEEE Trans. *Nucl. Sci.* NS28, 4142 (1981) and C. M. Dozier and D. B. Brown, "Effect of Photon Energy on the Response of MOS Devices," IEEE Trans. *Nucl. Sci.* NS28, 4137 (1981).) Dose enhancement is due to mobile electron charges at interfaces within the electronic devices in a manner quite analogous to the sensitivity enhancement effect discussed above for micropatterned X-ray resists. It is well known from X-ray imaging and other detector applications, such as X-ray streak cameras and X-ray diodes, that metal films perform quite well as X-ray photocathodes. That is, high atomic number materials like metals, upon absorbing X-rays, emit secondary electrons that have energy sufficient to escape surfaces, in excess of valence energies. Other materials, such as alkali halides and other nonmetals, are known to produce photoelectrons. These electrons, if liberated into a polymer resist from a nanoparticle of the respective composition, are available to perform the task of exposing the resist.

The encapsulated nanoparticulates provided in accordance with the invention for dose enhancement enable optimization of the nanoparticles for X-ray absorption and electron emission. Electron emission design parameters may adjust the energy spectrum of the electrons delivered to the resist, by suitably altering the composition and size of the core and capping layer. It is to be understood that the core itself may be composed of a single element, a compound, or a structured composition. The composition of the core may be metallic or nonmetallic. The density of the core may be solid density or under solid density. Similarly, the capping layer may be composed of a single molecular composition, or multiple compositions, or may be structured.

The loading of nanoparticles in the resist, i.e., the number of nanoparticles per unit volume, is also a parameter which may be varied.

The nanoparticle composition and size may be variously chosen to provide high absorption, and/or compatibility with processing chemistry, in accordance with other factors. The X-ray absorption, per particle, is increased as atomic number is increased and as particle size is increased. For example, as indicated above, gold nanoparticles perform as excellent X-ray absorbers. Also, gold is a well known photocathode. Gold nanoparticles of various sizes have also been encapsulated in a range of encapsulating layers.

The nanoparticles used may be optimized for absorption by X-rays as well as for ionizing photon, electron or ion beams.

The range of the photoelectron or Auger electron is also a design parameter. For example, the range of electrons emitted by Au layers into an overlayer of PMMA has been estimated as 50 nm, compared to a range of electrons emitted by PMMA into PMMA estimated as 25 nm, when using 13 Angstrom Cu L-alpha X-radiation. (See D. J. D. Carter, A. Pepin, M. R. Schweizer et al., "*Direct measurement of the effect of substrate photoelectrons in x-ray nanolithography*," J. Vac. Sci. technol. B 15 (6), 2509–13 (1997).)

The encapsulating layer thickness is also a design parameter which may be varied, e.g., to attain the desired dispersion properties. The encapsulating layers may be prepared with functional tail groups that are compatible with a solvent or with polymer matrix. The encapsulating layer also has an effect on electron transport.

As will be apparent from the foregoing, the range of sizes useful for nanoparticle design is limited by a few simple parameters. Core diameters may be arbitrarily small. However, too small a core will be ineffective when there is room for too few capping molecules on the small core surface to secure protection against agglomeration or unwanted chemical reactions. Another lower limit to core size is the degradation of average atomic number, and concomitant reduction in sensitivity enhancement, as the core size diminishes while the capping layer thickness remains constant. Thus, making the cores too small, as compared to the capping layer thickness, can reduce the advantages of the invention. Particle cores become too large when they excessively absorb their own emitted electrons, or when their size becomes appreciable compared to the resolution required in the lithographic process. To provide a specific example, particles of Au in the 1 to 10 nm range, with capping layers in the 0.4 to 5 nm range, are suitable for resists of interest. It is also noted that the core may be spherical, cylindrical or even one dimensional with a shell on one side or the other or on both sides.

The range of electrons emitted by the nanocore determines the efficacy of the sensitivity enhancement. It is well known that the range of electrons in condensed materials is less for higher density materials of higher atomic number. Thus, the range of electrons in the X-ray absorbing, higher-atomic-number core is shorter than the range in the lower-atomic-number photoresist. As an electron transits the core on its way to the resist, the electron loses energy which otherwise would be available to expose the resist. This effect becomes more important for lower energy electrons, such as may result from the absorption of a low energy X-ray photon of interest to lithography.

Figure 2:
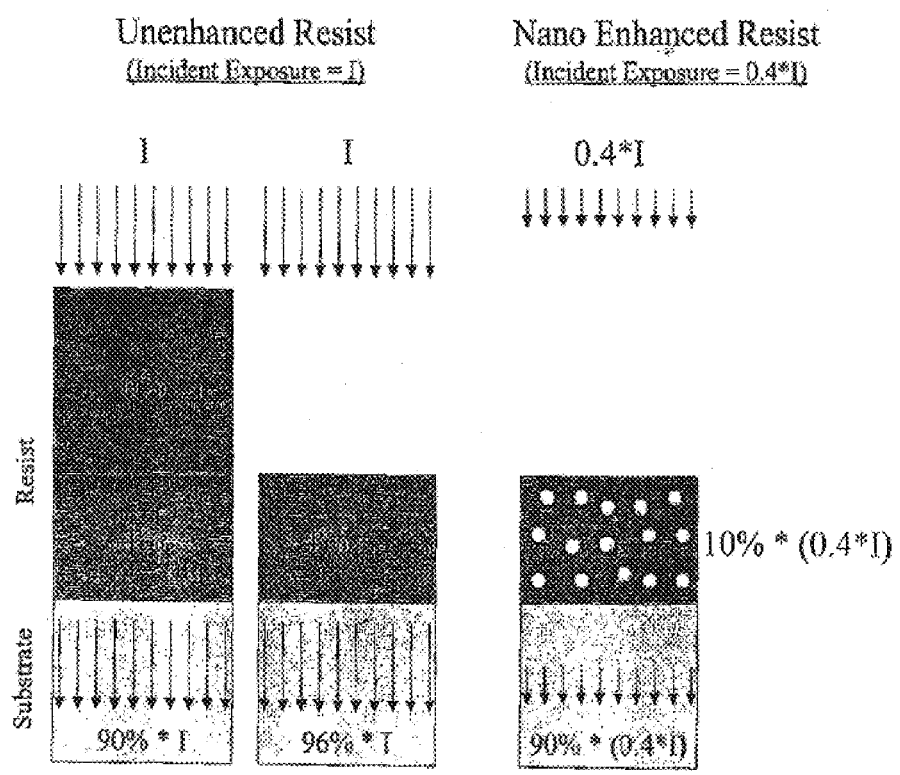
FIG. 2 is a schematic representation, not to scale, of one of the nanoparticles shown in FIG. 1, illustrating one preferred embodiment of the nanocore thereof.

In accordance with a further aspect of the invention, illustrated schematically in FIG. 2, the energy of the emitted electrons is more fully retained by use of a nanocore 14 comprising a low atomic number center 14a, such as a polystyrene nanosphere, coated with the higher atomic number (Z) shell or overlayer 14b of material such as gold. Of course, as set forth above, other metals and other materials can also be used. The thickness of the higher Z material is preferably chosen to be small compared to the electron range, and more preferably is of a thickness that results in the attenuation of less than approximately half of the electron energy. Under these conditions, the electrons emitted in the higher Z layer 14b will predominantly escape the layer. Those electrons emitted into the interior of the low Z nanocore 14a will suffer only fractional losses while transiting the low Z center and high Z layer as the electrons escape the nanoparticle and reach the resist. Those electrons emitted away from the core need only transit the capping layer 16 to reach the resist. Regardless of the direction of electron emission, electron energy loss in the core 14 is small.

As a result of the special nanocore described in the preceding paragraph, a significant advantage in electron exposure efficiency is attained. The provision of a nanocore having a low atomic number center 14a and an overlayer or shell 14b of a high atomic number X-ray absorber results in a shell geometry which is effective in allowing the electrons to escape the nanocore. This geometry is analogous to the shell geometry used in plutonium implosion nuclear weapons, where the purpose of the shell geometry is to allow spontaneously generated neutrons to escape the core (rather than induce an unwanted nuclear reaction).

There is an additional advantage to layered nanocores: the X-ray absorption of an individual core is diminished considerably. Therefore, the percentage of the incident X-ray beam absorbed by a single nanoparticle is diminished. This allows the particles to be loaded into the resist at higher numbers per unit volume, enhances the volumetric exposure uniformity, and allows a finer degree of control over the X-ray absorption statistics in the sensitized resist, as compared with solid cores of the same diameter. It is also noted that the core may be spherical, cylindrical or even one dimensional with a shell on one side or the other or on both sides.

For higher energy electrons, solid cores will suffice. Thus, the nanocore geometry is also a design parameter, ranging from solid core to shell, to attain the proper balance of X-ray capture and electron escape. For example, a calculation of electron ranges based on the formulation of K. Kanaya and S. Okayama, J. Phys. D. Applied Physics, 5, 43 (1972), gives the 2 keV electron range as 17 nm (where solid cores will be sufficient), whereas at a level of 0.35 keV the range has dropped below 1 nm (where shell cores would add efficiency). These electron energies are in the range of anticipated electron energies for cases of interest to X-ray lithography.

As indicated above, there are several different types of resists in use for lithography, and these vary in their molecular structure as well as the chemical processes involved in the exposure. It is to be understood that the encapsulating layers can be prepared so as to make the nanoparticle compatible with virtually any polymer resist composition. The nanoparticle then may be uniformly suspended in the resist. When the resist is cast on the substrate in the lithographic application, the uniformly suspended nanoparticles are present and wilt provide a dose enhancement during exposure, thus achieving the advantages discussed above and summarized below.

It will be appreciated from the foregoing that the dose enhanced resists of the invention provide a number of important advantages. The dose enhanced resists achieve increased sensitivity without compromising the polymer chemistry of the resist matrix. Further, the dose enhanced resists reduce the exposure to the substrate. Moreover, the dose enhanced resists reduce exposure times, increase the lifetimes of exposure sources, and increase the processing throughput. The resists can also be made thinner.

Although the invention has been described above in relation to preferred embodiments thereof, it will be understood by those skilled in the art that variations and modifications can be effected in these preferred embodiments without departing from the scope and spirit of the invention.

What is claimed is:

1. A resist composition with enhanced X-ray and election sensitivity, said composition comprising:
    a base resist material, and
    a plurality of chemically inert nanoparticles dispersed throughout the resist material, said nanoparticles having a higher atomic number than said resist material, and each of said nanoparticles comprising a nanoparticle core coated with a capping layer for rendering the core dispersible and chemically compatible with the resist material surrounding the nanoparticle.

2. A composition according to claim 1 wherein said nanoparticles comprise ligand stabilized metal nanoclusters.

3. A composition according to claim 1 wherein said nanoparticle core comprises a metal core and said capping layer comprises an organic shell surrounding the metal core.

4. A composition according to claim 1 wherein said nanoparticle core comprises a noble metal.

5. A composition according to claim 1 wherein said nanoparticle core has a diameter of between about 1 and about 10 nm.

6. A composition according to claim 3 wherein said shell comprises a monomolecular layer of an organic surfactant.

7. A composition according to claim 3 wherein said shell comprises a ligand molecule encapsulating the core.

8. A composition according to claim 7 wherein said shell has a thickness of between about 0.4 to 4 nm.

9. A composition according to claim 7 wherein said ligand molecule has a chain structure and is terminated by a head functional group bonded to a metal atom at the surface of the metal core.

10. A composition according to claim 9 wherein said core comprises a gold core and said ligand molecule comprises an alkane thiol bonded to the gold core.

11. A composition according to claim 1 wherein said core comprises a metal selected from the group consisting of noble metals, chromium, titanium and copper.

12. A composition according to claim 1 wherein said resist material comprises of a matrix of a resist polymer film.

13. A composition according to claim 1 wherein said nanoparticle core comprises a center core of a first material of a first atomic number and an overlayer of a second material of a higher atomic number.

14. A composition according to claim 1 wherein said capping layer is organic.

15. A composition according to claim 13 wherein said second material comprises an X-ray absorber.

16. A composition according to claim 15 wherein said second material comprises gold.

17. A composition according to claim 13 wherein said first material comprises polystyrene.

18. A composition according to claim 13 wherein said overlayer has a thickness producing a degradation of electron energy no greater than half of the electron energy.

19. A method of making a resist composition comprising:
    providing a resist material; and
    dispersing chemically inert nanoparticles throughout said resist material, wherein said nanoparticles comprise a higher atomic number than said resist material and wherein said nanoparticles comprise a core/shell structure.

20. A method of making a resist composition comprising:
    providing a resist material;
    providing a nanoparticle core wherein said nanoparticle core comprises a higher atomic number than said resist material;
    coating said nanoparticle core with an organic capping layer; and
    dispersing said nanoparticle core throughout said resist material.

21. The method of claim 20 wherein said organic capping layer renders said nanoparticle core dispersible and chemically compatible with said resist material.

* * * * *